(12) United States Patent
Chen et al.

(10) Patent No.: US 6,297,993 B1
(45) Date of Patent: Oct. 2, 2001

(54) ACCELERATION VOLTAGE IMPLEMENTATION FOR A HIGH DENSITY FLASH MEMORY DEVICE

(75) Inventors: Johnny C. Chen, Cupertino, CA (US); Yasushi Kasa, Kawasaki (JP); Trung S. Pham, Fremont, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/712,382

(22) Filed: Nov. 13, 2000

Related U.S. Application Data
(60) Provisional application No. 60/199,590, filed on Apr. 25, 2000.

(51) Int. Cl.[7] .................................................. G11C 16/04
(52) U.S. Cl. ......................................................... 365/185.33
(58) Field of Search ........................................ 365/185.33

(56) References Cited

U.S. PATENT DOCUMENTS

| | | | |
|---|---|---|---|
| 5,263,000 | 11/1993 | Van Buskirk et al. | 365/226 |
| 5,291,446 | 3/1994 | Van Buskirk et al. | 365/189.09 |
| 5,612,921 | 3/1997 | Chang et al. | 365/226 |
| 5,708,387 | 1/1998 | Cleveland et al. | 327/536 |
| 5,969,986 | * 10/1999 | Wong et al. | 365/185.33 |
| 6,111,787 | * 8/2000 | Akaogi et al. | 365/185.33 |

OTHER PUBLICATIONS

AMD Datasheet for Am29LV640D/Am29LV641D, (first published May 4, 1999—see revision history on last page).

AMD Press Release #9965—"AMD Announces Industry's First 3.0–Volt, 64–Megabit Nor Flash Memory Device", p. 1 of 1, Apr. 26, 1999, ©1999 Advanced Micro Devices, Inc.

* cited by examiner

*Primary Examiner*—Trong Phan

(57) ABSTRACT

The reduction of electrical noise in a high voltage distribution path of a high density flash memory device is disclosed. High voltage brought on-chip from an external power source is transmitted over separate isolated voltage distribution paths to a voltage generator circuit. The voltage generator pumps up the voltage of one of the voltage paths and uses the pumped up voltage to control the distribution of the voltage from the other voltage path, whereby electrical noise from the voltage pump is isolated from the distributed voltage.

14 Claims, 4 Drawing Sheets

ACCELERATION VOLTAGE IMPLEMENTATION FOR A HIGH DENSITY FLASH MEMORY DEVICE

REFERENCE TO EARLIER FILED APPLICATION

This application claims the benefit of the filing date pursuant to 35 U.S.C. §119(e) of Provisional Application Serial No. 60/199,590 filed Apr. 25, 2000, the disclosure of which is hereby incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals two or four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 micro-seconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nano-seconds, a difference between flash memory of many orders of magnitude.

Another problem with existing flash memory devices has been the low density of storage offered as compared with traditional dynamic random access memory ("DRAM"). With the ever increasing need for storage space in modern electronic devices combined with the need to reduce the number of discrete components, there has been a corresponding pressure to increase the amount of storage available on a single flash memory device. This increase in storage density must not come at the expense of reliability.

One way to increase the storage capacity of a flash memory device is to use a core cell with a dual-level floating gate structure. Such a structure allows one core cell to represent more than one bit of information without increasing the size/area of the device. However, such dual-level core cells are difficult to design and implement because they require complex programming, erase and read logic. This is because the multiple voltage levels that can be stored in the cell now represent more than one logical value and the programming, erase and read logic must now be able to discriminate among these voltage levels. This raises concerns with the ability of the flash memory device to reliably store and retrieve data.

SUMMARY

The present invention is defined by the following claims, and nothing in this section should be taken as a limitation on those claims. By way of introduction, the preferred embodiments described below relate to a method of reducing noise in a high voltage distribution path of a high density flash memory device comprising an array of single level flash memory cells. The method comprises: receiving a high voltage power by the flash memory device from an external source; distributing the high voltage power along first and second paths; pumping up the voltage on the first path, the pumping being isolated from the second path; and controlling distribution of the high voltage power from the second path utilizing the pumped up voltage from the first path.

The preferred embodiments further relate to a noise reduction circuit for a high density flash memory device comprising an array of single level flash memory cells. The noise reduction circuit includes a high voltage input operative to receive a high voltage from a source external to the high density flash memory device and first and second distribution paths. The circuit further includes a transmission circuit coupled with the high voltage input and the first and second distribution paths, which is operative to transmit the high voltage over the first and second distribution paths. In addition, the circuit includes a pump comprising an input coupled with the first distribution path and a pump output. The voltage pump is operative to pump up the high voltage and output the pumped up high voltage to the pump output. Further, the noise reduction circuit includes a distribution circuit comprising a first input coupled with the pump output, a second input coupled with the second distribution path and an output. The distribution circuit is operative to selectively pass said high voltage from the second input to the output under the control of the first input.

DETAILED DESCRIPTION OF THE PRESENTLY PREFERRED EMBODIMENTS

Herein, the phrase "coupled with" is defined to mean directly connected to or indirectly connected with through one or more intermediate components. Further, as used herein, the phrase "high logic level" is used to indicate a logic level of 1 and the phrase "low logic level" is used to indicate a logic level of 0. It will be understood that the signals underlying these representations are actually represented by voltage values. A signal is said to be "asserted" when it has a value which is significant to the logic it is driving. Some signals are asserted when they are at a low logic level (also referred to as "active low") and some signals are asserted when they are at a high logic level (also referred to as "active high"). It will be appreciated that all forms of digital logic representation are contemplated including mixed logic. It will further be appreciated that the underlying voltages of the logic signals may also vary, with typical values being 2 or 3 Volts representing a logic 1 and 0 Volts representing logic 0.

Figure 1:
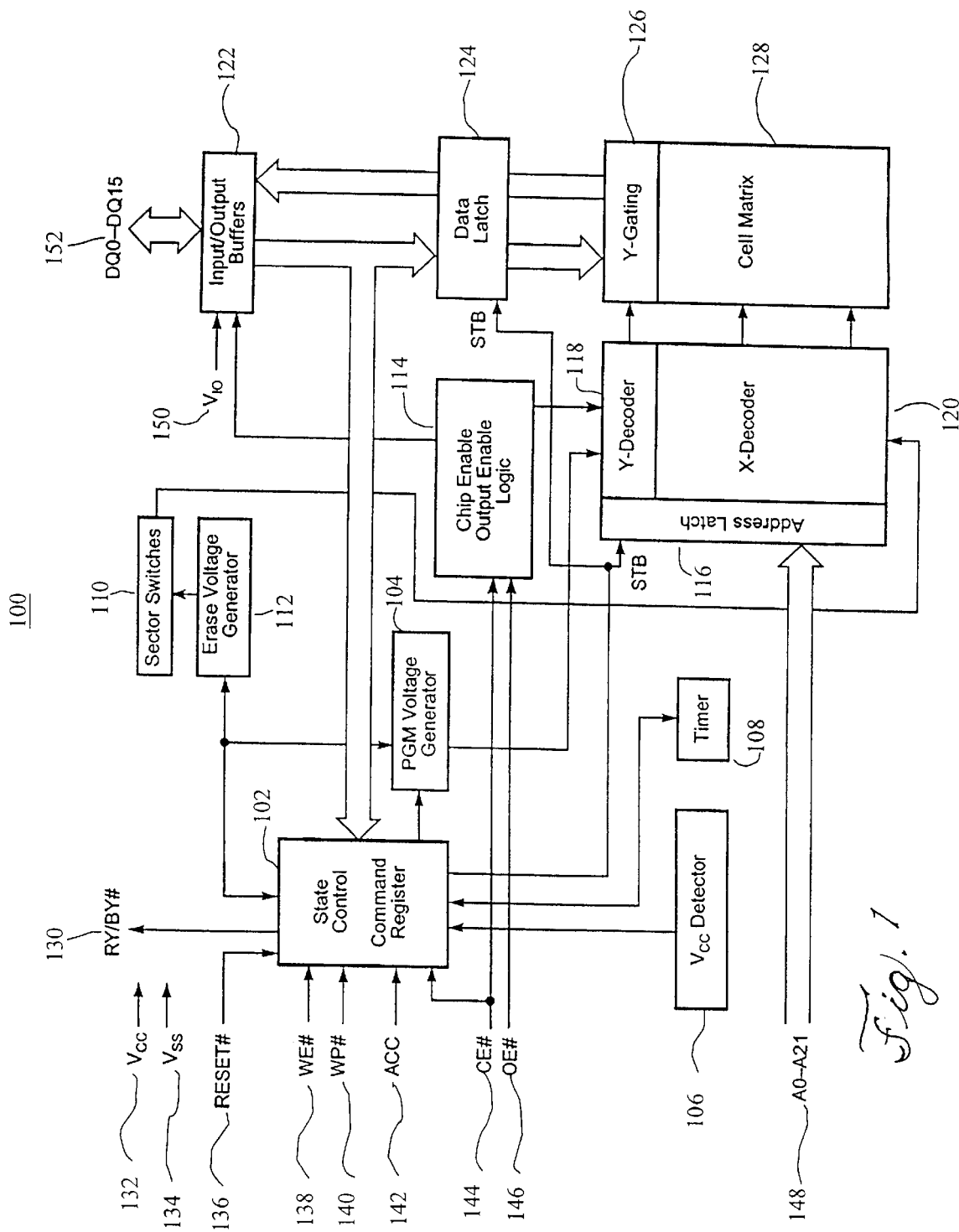
FIG. 1 depicts a block diagram of a 64 Mb flash memory chip according to the present invention.

Referring now to the Figures and in particular, FIG. 1, there is schematically shown a flash memory device 100 according to the present invention that provides 64 megabits (Mb) of storage using a single level NOR type flash memory cell. An exemplary flash memory device 100 is the Am29LV640DIJ and Am29LV641DU 64 Mb flash memory chips manufactured by Advanced Micro Devices, Inc., located in Sunnyvale, Calif. These devices are discussed in more detail in "Advance Information: Am29LV640DU/Am29LV641DU 64 Megabit (4 M×16-Bit) CMOS 3.0 Volt-only Uniform Sector Flash Memory with Versatile I/O™ Control," published by Advanced Micro Devices, Inc., located in Sunnyvale, Calif., herein incorporated by reference.

The exemplary flash memory device 100 utilizes a single level NOR flash memory cell which is fabricated using a 0.25$\mu$m technology. This allows higher densities and smaller die sizes. In addition single level NOR flash memory cells require less complex programming, erase and read logic versus dual level memory cells. Further, it is easier to ensure uniform cell performance across a large array of single level NOR cells.

The device 100 includes a state control and command register 102, a program voltage generator 104, a Vcc detector 106, a timer 108, sector switches 110, an erase voltage generator 112, chip and output enable logic 114, an address latch 116, a Y-decoder 118, an X-decoder 120, input/output buffers 122, a data latch 124, Y-gating 126 and the cell matrix/array 128. The device 100 further includes inputs and outputs for ready/busy 130, labeled "RY/BY#", operating power 132, labeled "Vcc", ground 134, labeled "Vss", reset 136, labeled "RESET#", write enable 138, labeled "WE#", write protect 140, labeled "WP#", accelerate 142, labeled "ACC", chip enable 144, labeled "CE#", output enable 146, labeled "OE#", a 22 bit address input bus 148, labeled "A0–A21", output buffer power 150, labeled "Vio", and a 16 bit data input/output bus 152, labeled "DQ0–DQ15". The # following a signal name indicates that this signal is asserted when it has a low logic value (active low). In one embodiment, all of the components of FIG. 1 are contained on a single integrated circuit chip. The operation and use of these input and output signals is further explained in the above mentioned reference. Note that the exemplary flash memory device 100, having 64 megabits (or 8 megabytes) is word addressable and therefore accommodates a 22 bit address input 148 and a 16 bit data input/output 152. It will be appreciated that the data size granularity with which the device 100 can be accessed can vary with the implementation and amount of total storage, with a smaller granularity requiring more input address bits and fewer data input/output bits and vice versa, and all such implementations are contemplated. For example, a device 100, having 64 megabits of storage, which is byte addressable requires 23 address bit inputs 148 and 8 data input/outputs 152. In another alternative, the device 100 supports both word and byte addressing on the same integrated circuit.

The state control and command register 102 includes the state machine and control logic which controls the operation of the device 100. This includes controlling the embedded programming and erase operations as well as other general operations of the device 100, which are discussed in more detail below. The state control and command register is responsive to the reset input 136, the write enable input 138, the write protect input 140, the accelerate input 142 and the chip enable input 144. The reset input is used to perform a hardware reset of the device 100. The write enable input 138 is used to signal the device 100 that data is to be stored in the array 128. The write protect input 140 is used to control the write protect functions of the device 100 which prevent accidental erasure of the contents stored in the array 128. The accelerate input 142 is used to speed up programming and erase functions. The chip enable input 144 is used to enable access to the device 100. The state control and command register further includes a ready/busy output 130 which indicates when the device is busy undergoing an embedded operation.

The PGM voltage generator 104 generates the necessary voltages for programming the flash memory cells of the cell matrix/array 128. The erase voltage generator 112 generates the necessary voltages for erasing the flash memory cells of the array 128. The voltage generators 104 and 112 contain voltage pumps (not shown) and switching multiplexers (not shown) which generate and route the necessary high voltages for erasing and programming flash memory cells as well as generating the necessary voltages for read operations under the direction of the state control and command register 102. These voltage pumps include a VPXGG pump, a voltage booster circuit, a VPPIG pump, a drain pump and a negative pump.

The VPXGG pump is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference.

During read operations, the voltage booster is used to boost the word line voltage while the drain pump is used to boost the bit line voltage prior to sensing the output voltage levels. A more detailed description of one exemplary implementation of a voltage booster circuit can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

The VPPIG pump is a high voltage pump used to pass high voltage to the drain of the memory cells. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference.

The negative pump is used to generate a relatively high negative voltage to the control gates of selected memory cells via the word lines. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

Referring back to FIG. 1, the flash memory device 100 further includes a Vcc detector 106 which detects when normal operating power is applied to the device 100. The Vcc detector 106 signals the state control and command register 102 when proper Vcc is detected. The timer 108 is used by the state control and command register 102 to properly control and synchronize the embedded program and erase operations. The sector switches 110 are used to route the voltages used during the erase operation to the proper sectors which are undergoing erase. The Chip and output enable logic 114 is responsive to the chip enable 144 and output enable 146 inputs. This logic is used to enable the device 100 to receive and pass data via the input/output buffers 122. The address latch 116 receives the address for a read or write operation from the address inputs 148. The address latch 116 latches the address for subsequent decoding. The Y-decoder 118 decodes the column address in the memory array 128 from the address latched in the address latch 116 . The X-decoder 120 decodes the row address in the memory array 128 from the address latched in the address latch 116. The input/output buffers 122 buffer read data that is being output and write data that is being input to/from the external data bus 152 of the device 100. The input/output buffers receive power from an external voltage source, Vio 150 . The data latch 124 latches and holds data being written to the array 128 coming from the input/output buffers 122 or data being read from the array 128 going to the buffers 122. The data latch 124 holds the data steady so it can be written or output depending on the operation underway. The Y-gating 126 gates the data being read from or written to the array 128. The cell matrix/array 128 includes an array of flash memory cells arranged in a row and column addressable format. Alternatively, the cell matrix/array 128 may include one or more banks to subdivide the accessible memory along with the additional hardware necessary to support multiple banks. The individual memory cells in the array 128 are further sub-grouped into sectors such that one or more sectors may be erased at any given time. In the exemplary flash memory device 100, the array 128 is arranged as 128 64 kilobyte sectors. It will be appreciated that there are many ways to implement the basic structure of the flash memory device 100 including alternate input/output interfaces alternate memory array structures along with accompanying supporting logic and all such alternatives are contemplated.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state control and command register 102, which uses a command register to manage the commencement of either sequence. The erase and programming operations are only accessed via the command register which controls an internal state machine that manages device operations. Commands are written to the command register via the data inputs 152 to the memory device 100.

In the memory device 100, each memory cell, within the cell array 128, includes a single level nor-type floating gate transistor (not shown). It will be appreciated by those skilled in the art, however, that there are many ways to implement a single level flash memory cell and that the configurations and operating characteristics may vary. It will further be appreciated that the embodiments disclosed herein are generally applicable and not limited to one particular implementation of a single level flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump. An exemplary high positive voltage applied to the source during an erase is approximately 5 volts and an exemplary high negative voltage applied to the control gate/word line by the negative pump is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply and the control gate/word line is connected to a high voltage provided by the VPXGG pump positive power supply. An exemplary high voltage applied to the drain by the VPPIG is approximately 5 Volts while an exemplary high voltage applied to the control gate by the VPXGG pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell requires higher than normal voltages, reading from the cell only requires the availability of the normal supply voltage. To read from the memory cell, the source is connected to ground (also referred to as Vss) and the control gate/word line are connected to the booster power supply. Prior to selecting the transistors for a read, the bit lines are charged up via the drain pump. When the cells turn on (if erased), they will connect their respective bit line to ground, grounding out the bit line. The current value of the memory cell is then sensed from the drain/bit line connection. The booster power supply is used to boost the word lines during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state command and control register 102. This logic 102 controls the multiplexers that place the proper voltages from the various power supplies and Vcc on the memory cell inputs depending on the desired function.

To solve some of the issues that surround the latency of program and erase operations in the exemplary flash memory device 100, accelerated program and erase modes are offered. The accelerated program mode improves the byte/word programming speed. Compared with the normal embedded programming mode, there are two main differences. One, during the program period, the bit-line and wordline voltages, as well as the array drain current are supplied from an external power supply through the ACC input 142 instead of from the internal voltage supplies. An external power supply can provide more current which allows for faster programming (faster transfer of charge to the floating gates of the cells undergoing the program operation). This external power supply is typically part of the external programming equipment used in the manufacturing of systems incorporating flash memory devices 100 or can be integrated into the system in which the flash memory device 100 is being utilized. Second, the stronger power supply allows the chip to complete programming of 16 bits simultaneously during a given programming pulse. The normal embedded program mode can only handle programming 5 bits simultaneously due to the current limitation of the internal drain pump. Therefore, in a worst case scenario, it would take four programming pulses to program 16 bits. Typically, the programming time for a word (2 bytes or 16 bits) can be reduced from 6.8$\mu$s to 3.8$\mu$s. This method of programming can provide a significant time savings in programming parts during manufacture.

An accelerated erase mode is also provided by the device 100. During this mode, 4 sectors can be erased at one time compared to the normal embedded erase function which can only erase 1 sector at a time. During an erase period, the source erase current is supplied from an external power supply via the ACC input 142 to the device 100. During an APDE period, the array drain current is supplied from an external power supply via the ACC input 142. APDE is a mode used to correct the threshold voltages of the flash memory cells for an over-erase condition. For pre-programming purposes, the above described fast program mode is engaged as well.

Figure 2:
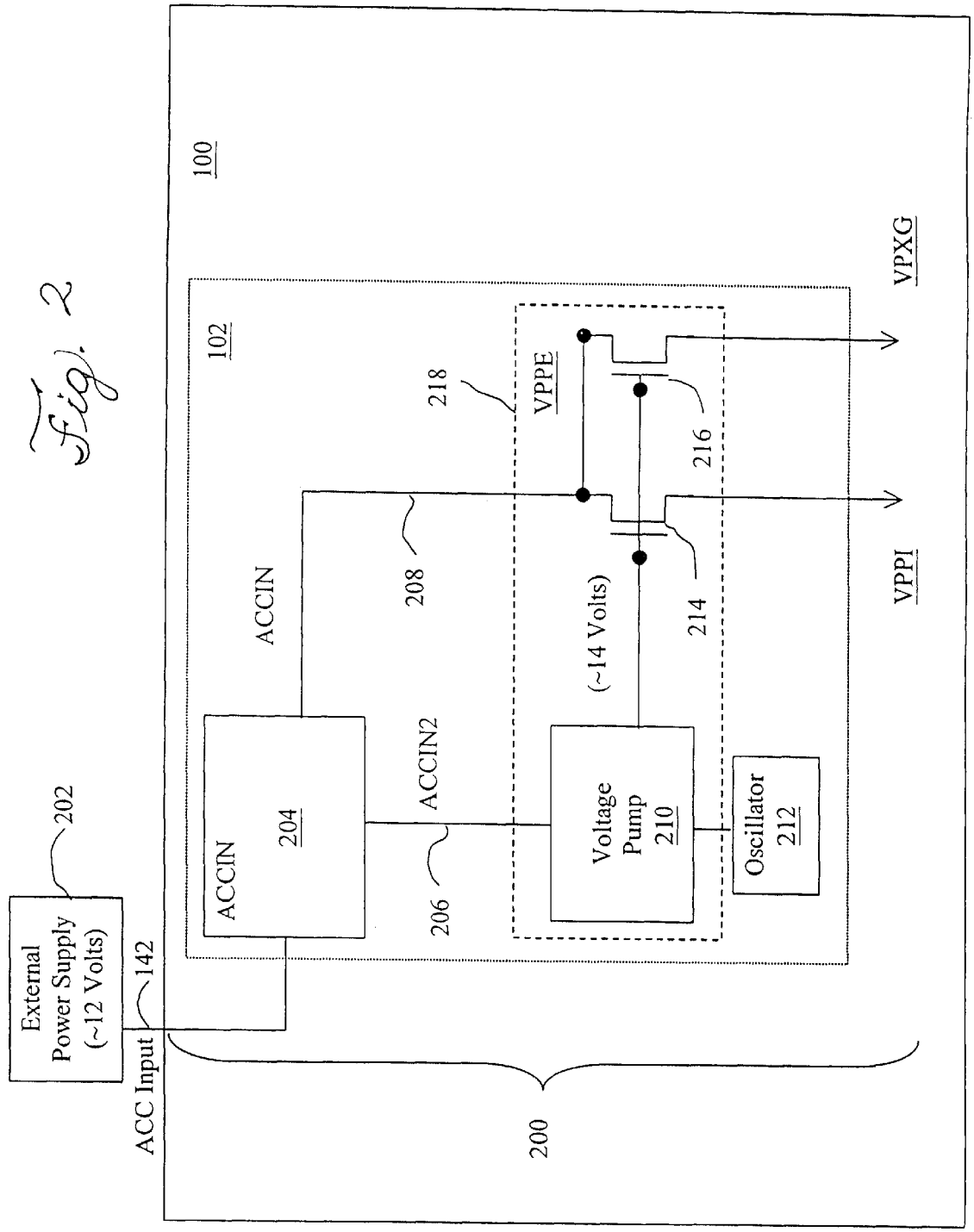
FIG. 2 depicts a block diagram showing the distribution path of the acceleration voltage according to a preferred embodiment.

Referring back to the figures, FIG. 2 shows a block diagram of a high voltage distribution path 200 of the device 100 from the ACC input 142. For clarity, a number of the components of FIG. 1 have been deleted in FIG. 2. The distribution path 200 includes an acceleration/high voltage transmission circuit 204, labeled "ACCIN", a voltage generator 218, labeled "VPPF", and an oscillator 212. The transmission circuit 204 receives the high voltage power which is supplied from a source 202 external to the device 100 over the ACC input 142 as described above. The transmission circuit 204 divides the high voltage power along two separate and isolated distribution paths 206, 208, labeled "ACCIN" and "ACCIN2", as described below. Both paths 206, 208 connect to the voltage generator 218. In acceleration mode (as described above), the voltage generator 218 passes the high voltage power to the array 128 via the signal paths labeled "VPPI" an "VPXG" where it is decoded and routed to the proper inputs of the selected memory cells undergoing the program or erase operation. The oscillator 212 is coupled with the voltage generator 218 and is used to pump up internally generated voltages as well as the externally supplied high voltage power as described below.

Figure 3:
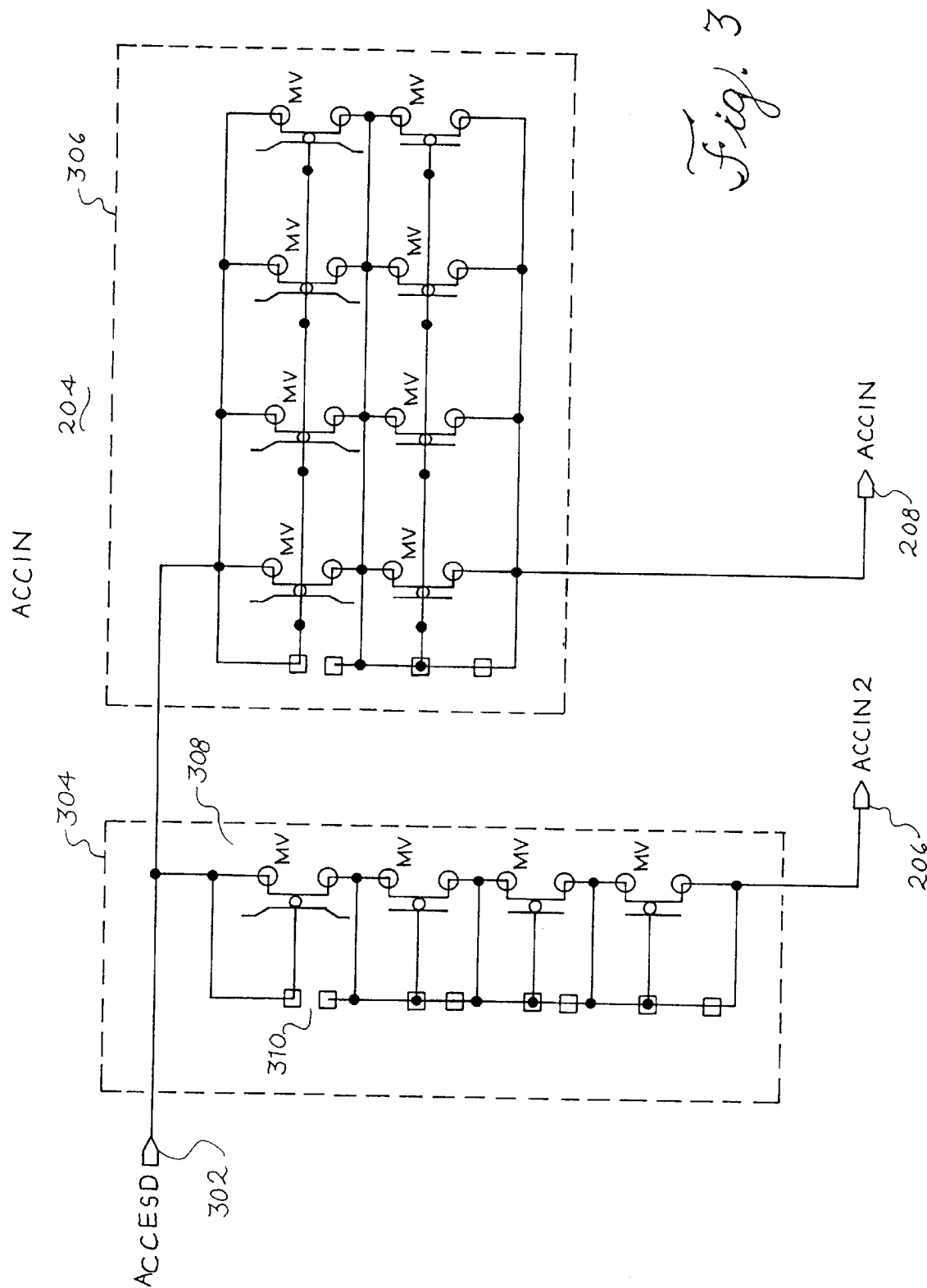
FIG. 3 depicts a schematic diagram of an acceleration voltage transmission circuit for use with distribution path of FIG. 2.

FIG. 3 shows a schematic diagram of the acceleration/high voltage transmission circuit 204. The circuit 204 has an input 302, labeled "ACCESD)", for the high voltage power from the external power source 202 and outputs 206, 208 for the distribution paths, ACCIN and ACCIN2. In the exemplary device 100, the high voltage power from the external power source 202 first passes through the ACC input 142 which consists of the chip input pin and integrated circuit pad and then to an electrostatic discharge device (not shown). From the electrostatic discharge device, the high voltage power passes to the acceleration/high voltage transmission circuit 204 via the ACCESD input 302. Such routing of external signals to the internal logic of an integrated circuit along with the associated electrostatic protection circuits are well known in the art.

The circuit 204 further contains voltage reduction circuits 304, 306 which lower the externally supplied voltage to a level which can be used by the device 100. In practice, manufacturers who utilize flash memory devices in their products may use more than one vendor to supply the needed devices. These devices may have varying operating characteristics including the maximum level of high voltage that can be input to the device without damaging it. This maximum level may be stipulated by an industry standard. In order to maintain compatibility, the device 100 is capable of accepting a wide range of high voltage input and can internally adjust the input voltage so as to prevent any internal damage. In the exemplary device 100, the high voltage can range approximately up to 12.5 Volts while the internal circuits can handle up to approximately 10.5 Volts. Each voltage reduction circuit 304, 306 includes a number of intrinsic NMOS transistors 308 with their gate and drain inputs coupled together to make the transistor 308 act like a diode. Instrinsic transistors have very low threshold voltages, on the order of 0.7 Volts. The voltage reduction circuits 304, 306 further include metal option circuits 310 which can be used to control the number of intrinsic transistors 308 in the voltage path from the input 302 to each output 206, 208. If the metal option circuit 310 is connected, the intrinsic transistor/diode 308 will be bypassed. Each intrinsic transistor 308 lowers the input voltage by approximately 0.7 Volts. In the preferred embodiment, where the high voltage input is approximately 12 Volts, as shown in FIG. 2, the voltage on the ACCIN2 output 206 will be reduced to approximately 11.3 Volts and reduced to approximately 9.5 Volts on the ACCIN output 208. It will be appreciated that protection circuits are known in the art and that the voltage levels at which damage may occur to the device 100 are implementation dependent. The circuit 204 is capable of reducing the input voltage by as much as 1.4 Volts on the ACCIN signal path 208 and by as much as 2.8 Volts on the ACCIN2 signal path 206.

The circuit 204 divides the high voltage input along the two isolated distribution paths 206, 208 and reduces the voltage level to level which will not damage the internal circuitry of the device 100.

Figure 4:
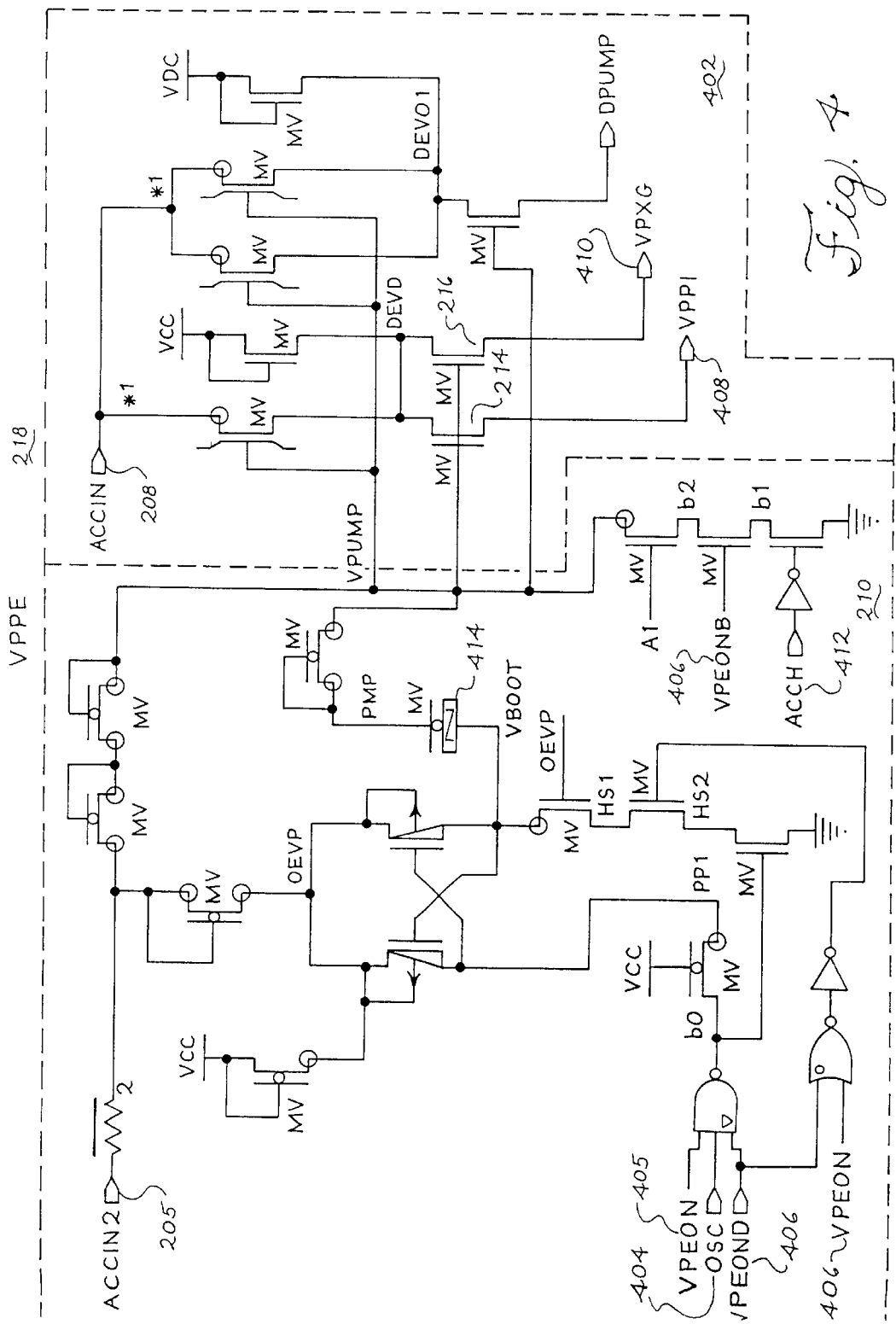
FIG. 4 depicts a schematic diagram of a voltage generator circuit for use with the distribution path of FIG. 2.

FIG. 4 shows a schematic diagram of a voltage generator 218. The voltage generator 218 includes a voltage pump 210 and an acceleration voltage distribution circuit 402. The voltage pump 210 has inputs for the ACCIN2 high voltage distribution path 206 from the high voltage transmission circuit 204, an input 404 for the oscillation signal generated by the oscillator 212 and inputs 406, 412 for control signals from the state command and control logic 102 which activate the voltage generator 218. Utilizing the oscillator 212 to pump an NMOS capacitor 414, the voltage pump 210 pumps up the high voltage power off the ACCIN2 distribution path 206. In the preferred embodiments, the pump 210 is capable of pumping up the voltage on the ACCIN2 distribution path 206 by two times the intrinsic transistor voltage threshold, i.e. the pumped voltage=$V_{ACCIN2}+2\times Vt$, where Vt=0.7 Volts. In the exemplary device 100 where the ACCIN2 voltage is at about 11.3 volts, the pump 210 will raise the voltage to about 12.7 Volts, with a typical range of about 11 Volts to about 13.5 Volts. The pumped up high voltage is then used by the acceleration distribution circuit 402 as described below.

The acceleration distribution circuit 402 has an input 208 for ACCIN high voltage distribution path 208 from the high voltage transmission circuit 204 and outputs 408 and 410 which are coupled with the VPXG and VPPI voltage distribution paths which carry the high voltage power to the memory array 128. The acceleration distribution circuit 402 switches and couples the high voltage power from high voltage transmission circuit 204 to the memory array 128 via the VPXG and VPPI voltage distribution paths. The acceleration distribution circuit 402 further includes switching NMOS transistors 214 and 216 which are used to gate the flow of power from the input 208 to the outputs 408 and 410. It is known that to pass voltage and current from the source to the drain of NMOS transistor efficiently and with little or no loss in voltage or current, the voltage difference between the gate and the drain must be greater than the voltage difference between the source and the drain of the transistor. Therefore, the pumped up voltage, which is about 14 Volts is coupled with the gate inputs of the switching NMOS transistors 214 and 216. The ACCIN voltage is approximately 10 Volts. Therefore the gate/drain voltage is greater than the source/drain voltage and the transistors 214 and 216 will pass all 10 Volts to the VPXG and VPPI outputs 408 and 410 with little or no loss.

By separating and isolating the high voltage distribution paths 206 and 208 to the voltage pump 210 and the acceleration voltage distribution circuit 402, electrical noise generated by the oscillator 212 is isolated from the voltage and current distributed to the array 128.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. A method of reducing noise in a high voltage distribution path of a high density flash memory device comprising an array of single level flash memory cells, said method comprising:

(a) receiving a high voltage power by said flash memory device from a source external to said flash memory device;

(b) distributing said high voltage power along first and second paths;

(c) pumping up the voltage on said first path, said pumping being isolated from said second path; and (d) controlling distribution of said high voltage power from said second path utilizing said pumped up voltage from said first path.

2. The method of claim 1, wherein said high voltage power is about 12 volts.

3. The method of claim 1, wherein said pumped up voltage is about 12.7 volts.

4. The method of claim 1, wherein (c) further comprises connecting said second path to a source input of an n-mos transistor and connecting said pumped up voltage to a gate input of said n-mos transistor.

5. A high density flash memory device comprising:

an array of single level flash memory cells; and a noise reduction circuit operative to reduce noise on a high voltage power distribution path coupled with said array;

wherein said noise reduction circuit comprises:

a high voltage power input operative to receive a high voltage power from a source external to said high density flash memory device;

first and second power distribution paths;

a transmission circuit coupled with said high voltage power input and said first and second power distribution paths and operative to transmit said high voltage power over said first and second power distribution paths;

a voltage pump comprising an input coupled with said first power distribution path and a pump output, said voltage pump operative to pump up said high voltage power and output said pumped up power to said pump output; and a distribution circuit comprising a first input coupled with said pump output of said voltage pump, a second input coupled with said second power distribution path and an output, said distribution circuit operative to selectively pass said high voltage power from said second input to said output under the control of said first input.

6. The high density flash memory device of claim 5, wherein said transmission circuit is further operative to electrically isolate said first and second power distribution paths.

7. The high density flash memory device of claim 5, wherein said high voltage power is about 12 volts.

8. The high density flash memory device of claim 5, wherein said pumped up power is about 14 volts.

9. The high density flash memory device of claim 5, wherein said distribution circuit comprises an n-mos transistor including a gate input, a source input and a drain output, and further wherein said first input is coupled with said gate input, said second input is coupled with said source input and said output is coupled with said drain output.

10. A noise reduction circuit for a high density flash memory device comprising an array of single level flash memory cells, said noise reduction circuit comprising:

a high voltage input operative to receive a high voltage from a source external to said high density flash memory device;

first and second distribution paths;

a transmission circuit coupled with said high voltage input and said first and second distribution paths and operative to transmit said high voltage over said first and second distribution paths;

a pump comprising an input coupled with said first distribution path and a pump output, said voltage pump operative to pump up said high voltage and output said pumped up high voltage to said pump output; and a distribution circuit comprising a first input coupled with said pump output, a second input coupled with said second distribution path and an output, said distribution circuit operative to selectively pass said high voltage from said second input to said output under the control of said first input;

wherein electrical noise is reduced on said output.

11. The noise reduction circuit of claim 10, wherein said transmission circuit is further operative to electrically isolate said first and second distribution paths.

12. The noise reduction circuit of claim 10, wherein said high voltage is about 12 volts.

13. The noise reduction circuit of claim 10, wherein said pumped up high voltage is about 12.7 volts.

14. The noise reduction circuit of claim 10, wherein said distribution circuit comprises an n-mos transistor including a gate input, a source input and a drain output, and further wherein said first input is coupled with said gate input, said second input is coupled with said source input and said output is coupled with said drain output.

* * * * *